US010037722B2

(12) United States Patent
Trock

(10) Patent No.: US 10,037,722 B2
(45) Date of Patent: Jul. 31, 2018

(54) DETECTING BREAKAGE IN A DISPLAY ELEMENT

(71) Applicant: MEDTRONIC MINIMED, INC., Northridge, CA (US)

(72) Inventor: Adam S. Trock, Burbank, CA (US)

(73) Assignee: Medtronic MiniMed, Inc., Northridge, CA (US)

( * ) Notice: Subject to any disclaimer, the term of this patent is extended or adjusted under 35 U.S.C. 154(b) by 14 days.

(21) Appl. No.: 14/931,701

(22) Filed: Nov. 3, 2015

(65) Prior Publication Data

US 2017/0124929 A1 May 4, 2017

(51) Int. Cl.

| | |
|---|---|
| ***G01R 31/26*** | (2014.01) |
| ***G09G 3/00*** | (2006.01) |
| *G09G 3/36* | (2006.01) |

(52) U.S. Cl.

CPC ........... *G09G 3/006* (2013.01); *G09G 3/3648* (2013.01)

(58) Field of Classification Search

CPC .............................. G01R 31/2827; H02H 3/20

USPC ......................................... 324/500, 537, 549

See application file for complete search history.

(56) References Cited

U.S. PATENT DOCUMENTS

| | | | |
|---|---|---|---|
| 3,631,847 | A | 1/1972 | Hobbs, II |
| 4,212,738 | A | 7/1980 | Henne |
| 4,270,532 | A | 6/1981 | Franetzki et al. |
| 4,282,872 | A | 8/1981 | Franetzki et al. |
| 4,373,527 | A | 2/1983 | Fischell |
| 4,395,259 | A | 7/1983 | Prestele et al. |
| 4,433,072 | A | 2/1984 | Pusineri et al. |
| 4,443,218 | A | 4/1984 | DeCant, Jr. et al. |
| 4,494,950 | A | 1/1985 | Fischell |
| 4,542,532 | A | 9/1985 | McQuilkin |
| 4,550,731 | A | 11/1985 | Batina et al. |

(Continued)

FOREIGN PATENT DOCUMENTS

| | | |
|---|---|---|
| DE | 4329229 | 9/1995 |
| EP | 0319268 | 11/1988 |

(Continued)

OTHER PUBLICATIONS

PCT Search Report (PCT/US02/03299), dated Oct. 31, 2002, Medtronic MiniMed, Inc.

(Continued)

*Primary Examiner* — Giovanni Astacio-Oquendo

(74) *Attorney, Agent, or Firm* — Lorenz & Kopf, LLP

(57) ABSTRACT

The disclosed subject matter relates to diagnostic procedures and related device architectures that check the operating health of a display element of a host electronic device. In certain embodiments, a display apparatus for an electronic device includes a display element, a display controller, a conductive trace, and a detection circuit. The display element has an array of pixel elements formed overlying a substrate and arranged to define a viewable display area. The display controller is coupled to control activation of the array of pixel elements. The conductive trace is formed overlying the substrate and is arranged to bypass the display controller in a layout that does not interfere with visibility of the pixel elements. The detection circuit is coupled to the conductive trace, and it operates to check electrical continuity of the conductive trace to obtain an indication of health of the display element.

16 Claims, 8 Drawing Sheets

(56) References Cited

U.S. PATENT DOCUMENTS

| | | | |
|---|---|---|---|
| 4,559,037 | A | 12/1985 | Franetzki et al. |
| 4,562,751 | A | 1/1986 | Nason et al. |
| 4,671,288 | A | 6/1987 | Gough |
| 4,678,408 | A | 7/1987 | Nason et al. |
| 4,685,903 | A | 8/1987 | Cable et al. |
| 4,731,051 | A | 3/1988 | Fischell |
| 4,731,726 | A | 3/1988 | Allen, III |
| 4,781,798 | A | 11/1988 | Gough |
| 4,803,625 | A | 2/1989 | Fu et al. |
| 4,809,697 | A | 3/1989 | Causey, III et al. |
| 4,826,810 | A | 5/1989 | Aoki |
| 4,871,351 | A | 10/1989 | Feingold |
| 4,898,578 | A | 2/1990 | Rubalcaba, Jr. |
| 5,003,298 | A | 3/1991 | Havel |
| 5,011,468 | A | 4/1991 | Lundquist et al. |
| 5,019,974 | A | 5/1991 | Beckers |
| 5,050,612 | A | 9/1991 | Matsumura |
| 5,078,683 | A | 1/1992 | Sancoff et al. |
| 5,080,653 | A | 1/1992 | Voss et al. |
| 5,097,122 | A | 3/1992 | Colman et al. |
| 5,100,380 | A | 3/1992 | Epstein et al. |
| 5,101,814 | A | 4/1992 | Palti |
| 5,108,819 | A | 4/1992 | Heller et al. |
| 5,153,827 | A | 10/1992 | Coutre et al. |
| 5,165,407 | A | 11/1992 | Wilson et al. |
| 5,247,434 | A | 9/1993 | Peterson et al. |
| 5,262,035 | A | 11/1993 | Gregg et al. |
| 5,262,305 | A | 11/1993 | Heller et al. |
| 5,264,104 | A | 11/1993 | Gregg et al. |
| 5,264,105 | A | 11/1993 | Gregg et al. |
| 5,284,140 | A | 2/1994 | Allen et al. |
| 5,299,571 | A | 4/1994 | Mastrototaro |
| 5,307,263 | A | 4/1994 | Brown |
| 5,317,506 | A | 5/1994 | Coutre et al. |
| 5,320,725 | A | 6/1994 | Gregg et al. |
| 5,322,063 | A | 6/1994 | Allen et al. |
| 5,338,157 | A | 8/1994 | Blomquist |
| 5,339,821 | A | 8/1994 | Fujimoto |
| 5,341,291 | A | 8/1994 | Roizen et al. |
| 5,350,411 | A | 9/1994 | Ryan et al. |
| 5,356,786 | A | 10/1994 | Heller et al. |
| 5,357,427 | A | 10/1994 | Langen et al. |
| 5,368,562 | A | 11/1994 | Blomquist et al. |
| 5,370,622 | A | 12/1994 | Livingston et al. |
| 5,371,687 | A | 12/1994 | Holmes, II et al. |
| 5,376,070 | A | 12/1994 | Purvis et al. |
| 5,390,671 | A | 2/1995 | Lord et al. |
| 5,391,250 | A | 2/1995 | Cheney, II et al. |
| 5,403,700 | A | 4/1995 | Heller et al. |
| 5,411,647 | A | 5/1995 | Johnson et al. |
| 5,482,473 | A | 1/1996 | Lord et al. |
| 5,485,408 | A | 1/1996 | Blomquist |
| 5,505,709 | A | 4/1996 | Funderburk et al. |
| 5,497,772 | A | 5/1996 | Schulman et al. |
| 5,543,326 | A | 8/1996 | Heller et al. |
| 5,569,186 | A | 10/1996 | Lord et al. |
| 5,569,187 | A | 10/1996 | Kaiser |
| 5,573,506 | A | 11/1996 | Vasko |
| 5,582,593 | A | 12/1996 | Hultman |
| 5,586,553 | A | 12/1996 | Halili et al. |
| 5,593,390 | A | 1/1997 | Castellano et al. |
| 5,593,852 | A | 1/1997 | Heller et al. |
| 5,594,638 | A | 1/1997 | Illiff |
| 5,609,060 | A | 3/1997 | Dent |
| 5,626,144 | A | 5/1997 | Tacklind et al. |
| 5,630,710 | A | 5/1997 | Tune et al. |
| 5,643,212 | A | 7/1997 | Coutre et al. |
| 5,660,163 | A | 8/1997 | Schulman et al. |
| 5,660,176 | A | 8/1997 | Iliff |
| 5,665,065 | A | 9/1997 | Colman et al. |
| 5,665,222 | A | 9/1997 | Heller et al. |
| 5,685,844 | A | 11/1997 | Marttila |
| 5,687,734 | A | 11/1997 | Dempsey et al. |
| 5,704,366 | A | 1/1998 | Tacklind et al. |
| 5,750,926 | A | 5/1998 | Schulman et al. |
| 5,754,111 | A | 5/1998 | Garcia |
| 5,764,159 | A | 6/1998 | Neftel |
| 5,772,635 | A | 6/1998 | Dastur et al. |
| 5,779,665 | A | 7/1998 | Mastrototaro et al. |
| 5,788,669 | A | 8/1998 | Peterson |
| 5,791,344 | A | 8/1998 | Schulman et al. |
| 5,800,420 | A | 9/1998 | Gross et al. |
| 5,807,336 | A | 9/1998 | Russo et al. |
| 5,814,015 | A | 9/1998 | Gargano et al. |
| 5,822,715 | A | 10/1998 | Worthington et al. |
| 5,832,448 | A | 11/1998 | Brown |
| 5,840,020 | A | 11/1998 | Heinonen et al. |
| 5,861,018 | A | 1/1999 | Feierbach et al. |
| 5,868,669 | A | 2/1999 | Iliff |
| 5,871,465 | A | 2/1999 | Vasko |
| 5,879,163 | A | 3/1999 | Brown et al. |
| 5,885,245 | A | 3/1999 | Lynch et al. |
| 5,897,493 | A | 4/1999 | Brown |
| 5,899,855 | A | 5/1999 | Brown |
| 5,904,708 | A | 5/1999 | Goedeke |
| 5,913,310 | A | 6/1999 | Brown |
| 5,917,346 | A | 6/1999 | Gord |
| 5,918,603 | A | 7/1999 | Brown |
| 5,925,021 | A | 7/1999 | Castellano et al. |
| 5,933,136 | A | 8/1999 | Brown |
| 5,935,099 | A | 8/1999 | Peterson et al. |
| 5,940,801 | A | 8/1999 | Brown |
| 5,956,501 | A | 9/1999 | Brown |
| 5,960,403 | A | 9/1999 | Brown |
| 5,965,380 | A | 10/1999 | Heller et al. |
| 5,972,199 | A | 10/1999 | Heller et al. |
| 5,978,236 | A | 11/1999 | Faberman et al. |
| 5,997,476 | A | 12/1999 | Brown |
| 5,999,848 | A | 12/1999 | Gord et al. |
| 5,999,849 | A | 12/1999 | Gord et al. |
| 6,009,339 | A | 12/1999 | Bentsen et al. |
| 6,032,119 | A | 2/2000 | Brown et al. |
| 6,043,437 | A | 3/2000 | Schulman et al. |
| 6,081,736 | A | 6/2000 | Colvin et al. |
| 6,083,710 | A | 7/2000 | Heller et al. |
| 6,088,608 | A | 7/2000 | Schulman et al. |
| 6,101,478 | A | 8/2000 | Brown |
| 6,103,033 | A | 8/2000 | Say et al. |
| 6,119,028 | A | 9/2000 | Schulman et al. |
| 6,120,676 | A | 9/2000 | Heller et al. |
| 6,121,009 | A | 9/2000 | Heller et al. |
| 6,134,461 | A | 10/2000 | Say et al. |
| 6,143,164 | A | 11/2000 | Heller et al. |
| 6,162,611 | A | 12/2000 | Heller et al. |
| 6,175,752 | B1 | 1/2001 | Say et al. |
| 6,183,412 | B1 | 2/2001 | Benkowski et al. |
| 6,246,992 | B1 | 6/2001 | Brown |
| 6,259,937 | B1 | 7/2001 | Schulman et al. |
| 6,329,161 | B1 | 12/2001 | Heller et al. |
| 6,408,330 | B1 | 6/2002 | DeLaHuerga |
| 6,424,847 | B1 | 7/2002 | Mastrototaro et al. |
| 6,472,122 | B1 | 10/2002 | Schulman et al. |
| 6,484,045 | B1 | 11/2002 | Holker et al. |
| 6,484,046 | B1 | 11/2002 | Say et al. |
| 6,503,381 | B1 | 1/2003 | Gotoh et al. |
| 6,514,718 | B2 | 2/2003 | Heller et al. |
| 6,544,173 | B2 | 4/2003 | West et al. |
| 6,553,263 | B1 | 4/2003 | Meadows et al. |
| 6,554,798 | B1 | 4/2003 | Mann et al. |
| 6,558,320 | B1 | 5/2003 | Causey, III et al. |
| 6,558,351 | B1 | 5/2003 | Steil et al. |
| 6,560,741 | B1 | 5/2003 | Gerety et al. |
| 6,565,509 | B1 | 5/2003 | Say et al. |
| 6,579,690 | B1 | 6/2003 | Bonnecaze et al. |
| 6,591,125 | B1 | 7/2003 | Buse et al. |
| 6,592,745 | B1 | 7/2003 | Feldman et al. |
| 6,605,200 | B1 | 8/2003 | Mao et al. |
| 6,605,201 | B1 | 8/2003 | Mao et al. |
| 6,607,658 | B1 | 8/2003 | Heller et al. |
| 6,616,819 | B1 | 9/2003 | Liamos et al. |
| 6,618,934 | B1 | 9/2003 | Feldman et al. |
| 6,623,501 | B2 | 9/2003 | Heller et al. |
| 6,641,533 | B2 | 11/2003 | Causey, III et al. |
| 6,654,625 | B1 | 11/2003 | Say et al. |

(56) References Cited

U.S. PATENT DOCUMENTS

| | | | | |
|---|---|---|---|---|
| 6,659,980 | B2 | 12/2003 | Moberg et al. | |
| 6,671,554 | B2 | 12/2003 | Gibson et al. | |
| 6,676,816 | B2 | 1/2004 | Mao et al. | |
| 6,689,265 | B2 | 2/2004 | Heller et al. | |
| 6,728,576 | B2 | 4/2004 | Thompson et al. | |
| 6,733,471 | B1 | 5/2004 | Ericson et al. | |
| 6,746,582 | B2 | 6/2004 | Heller et al. | |
| 6,747,556 | B2 | 6/2004 | Medema et al. | |
| 6,749,740 | B2 | 6/2004 | Liamos et al. | |
| 6,752,787 | B1 | 6/2004 | Causey, III et al. | |
| 6,809,653 | B1 | 10/2004 | Mann et al. | |
| 6,881,551 | B2 | 4/2005 | Heller et al. | |
| 6,892,085 | B2 | 5/2005 | McIvor et al. | |
| 6,893,545 | B2 | 5/2005 | Gotoh et al. | |
| 6,895,263 | B2 | 5/2005 | Shin et al. | |
| 6,916,159 | B2 | 7/2005 | Rush et al. | |
| 6,932,584 | B2 | 8/2005 | Gray et al. | |
| 6,932,894 | B2 | 8/2005 | Mao et al. | |
| 6,942,518 | B2 | 9/2005 | Liamos et al. | |
| 7,153,263 | B2 | 12/2006 | Carter et al. | |
| 7,153,289 | B2 | 12/2006 | Vasko | |
| 7,396,330 | B2 | 7/2008 | Banet et al. | |
| 2001/0044731 | A1 | 11/2001 | Coffman et al. | |
| 2002/0013518 | A1 | 1/2002 | West et al. | |
| 2002/0055857 | A1 | 5/2002 | Mault et al. | |
| 2002/0082665 | A1 | 6/2002 | Haller et al. | |
| 2002/0137997 | A1 | 9/2002 | Mastrototaro et al. | |
| 2002/0161288 | A1 | 10/2002 | Shin et al. | |
| 2003/0060765 | A1 | 3/2003 | Campbell et al. | |
| 2003/0078560 | A1 | 4/2003 | Miller et al. | |
| 2003/0088166 | A1 | 5/2003 | Say et al. | |
| 2003/0144581 | A1 | 7/2003 | Conn et al. | |
| 2003/0152823 | A1 | 8/2003 | Heller | |
| 2003/0176183 | A1 | 9/2003 | Drucker et al. | |
| 2003/0188427 | A1 | 10/2003 | Say et al. | |
| 2003/0199744 | A1 | 10/2003 | Buse et al. | |
| 2003/0208113 | A1 | 11/2003 | Mault et al. | |
| 2003/0220552 | A1 | 11/2003 | Reghabi et al. | |
| 2004/0061232 | A1 | 4/2004 | Shah et al. | |
| 2004/0061234 | A1 | 4/2004 | Shah et al. | |
| 2004/0064133 | A1 | 4/2004 | Miller et al. | |
| 2004/0064156 | A1 | 4/2004 | Shah et al. | |
| 2004/0073095 | A1 | 4/2004 | Causey, III et al. | |
| 2004/0074785 | A1 | 4/2004 | Holker et al. | |
| 2004/0093167 | A1 | 5/2004 | Braig et al. | |
| 2004/0097796 | A1 | 5/2004 | Berman et al. | |
| 2004/0102683 | A1 | 5/2004 | Khanuja et al. | |
| 2004/0111017 | A1 | 6/2004 | Say et al. | |
| 2004/0122353 | A1 | 6/2004 | Shahmirian et al. | |
| 2004/0167465 | A1 | 8/2004 | Mihai et al. | |
| 2004/0263354 | A1 | 12/2004 | Mann et al. | |
| 2005/0038331 | A1 | 2/2005 | Silaski et al. | |
| 2005/0038680 | A1 | 2/2005 | McMahon et al. | |
| 2005/0154271 | A1 | 7/2005 | Rasdal et al. | |
| 2005/0192557 | A1 | 9/2005 | Brauker et al. | |
| 2006/0229694 | A1 | 10/2006 | Schulman et al. | |
| 2006/0238333 | A1 | 10/2006 | Welch et al. | |
| 2006/0293571 | A1 | 12/2006 | Bao et al. | |
| 2007/0088521 | A1 | 4/2007 | Shmueli et al. | |
| 2007/0135866 | A1 | 6/2007 | Baker et al. | |
| 2008/0154503 | A1 | 6/2008 | Wittenber et al. | |
| 2009/0081951 | A1 | 3/2009 | Erdmann et al. | |
| 2009/0082635 | A1 | 3/2009 | Baldus et al. | |
| 2010/0154238 | A1* | 6/2010 | Harshbarger | G01B 7/26 33/836 |
| 2012/0255371 | A1* | 10/2012 | Rieder | G01F 1/8404 73/861.357 |
| 2013/0271886 | A1 | 10/2013 | Cull et al. | |
| 2014/0055500 | A1 | 2/2014 | Lai | |
| 2014/0184558 | A1* | 7/2014 | Midholt | G06F 3/041 345/174 |
| 2014/0210806 | A1 | 7/2014 | Hwang | |
| 2014/0306979 | A1 | 10/2014 | Chun et al. | |
| 2015/0103062 | A1 | 4/2015 | Kwon et al. | |
| 2015/0145524 | A1* | 5/2015 | Duncan | G01R 31/024 324/538 |
| 2016/0054370 | A1* | 2/2016 | Fomin | G01R 31/025 324/509 |
| 2016/0063905 | A1 | 3/2016 | Bae et al. | |
| 2016/0178689 | A1* | 6/2016 | Okita | G01R 31/024 324/509 |

FOREIGN PATENT DOCUMENTS

| | | | |
|---|---|---|---|
| EP | 0806738 | | 11/1997 |
| EP | 0880936 | | 12/1998 |
| EP | 1338295 | | 8/2003 |
| EP | 1631036 | A2 | 3/2006 |
| GB | 2218831 | | 11/1989 |
| WO | WO 96/20745 | | 7/1996 |
| WO | WO 96/36389 | | 11/1996 |
| WO | WO 96/37246 | A1 | 11/1996 |
| WO | WO 97/21756 | | 6/1997 |
| WO | WO 98/20438 | | 5/1998 |
| WO | WO 98/24358 | | 6/1998 |
| WO | WO 98/42407 | | 10/1998 |
| WO | WO 98/49659 | | 11/1998 |
| WO | WO 98/59487 | | 12/1998 |
| WO | WO 99/08183 | | 2/1999 |
| WO | WO 99/10801 | | 3/1999 |
| WO | WO 99/18532 | | 4/1999 |
| WO | WO 99/22236 | | 5/1999 |
| WO | WO 00/10628 | | 3/2000 |
| WO | WO 00/19887 | | 4/2000 |
| WO | WO 00/48112 | | 8/2000 |
| WO | WO 02/058537 | A2 | 8/2002 |
| WO | WO 03/001329 | | 1/2003 |
| WO | WO 03/094090 | | 11/2003 |
| WO | WO 2005/065538 | A2 | 7/2005 |

OTHER PUBLICATIONS (Animas Corporation, 1999). Animas . . . bringing new life to insulin therapy.

Bode B W, et al. (1996). Reduction in Severe Hypoglycemia with Long-Term Continuous Subcutaneous Insulin Infusion in Type I Diabetes. Diabetes Care, vol. 19, No. 4, 324-327.

Boland E (1998). Teens Pumping it Up! Insulin Pump Therapy Guide for Adolescents. 2nd Edition.

Brackenridge B P (1992). Carbohydrate Gram Counting A Key to Accurate Mealtime Boluses in Intensive Diabetes Therapy. Practical Diabetology, vol. 11, No. 2, pp. 22-28.

Brackenridge, B P et al. (1995). Counting Carbohydrates How to Zero in on Good Control. MiniMed Technologies Inc.

Farkas-Hirsch R et al. (1994). Continuous Subcutaneous Insulin Infusion: A Review of the Past and Its Implementation for the Future. Diabetes Spectrum From Research to Practice, vol. 7, No. 2, pp. 80-84, 136-138.

Hirsch I B et al. (1990). Intensive Insulin Therapy for Treatment of Type I Diabetes. Diabetes Care, vol. 13, No. 12, pp. 1265-1283.

Kulkarni K et al. (1999). Carbohydrate Counting A Primer for Insulin Pump Users to Zero in on Good Control. MiniMed Inc.

Marcus A O et al. (1996). Insulin Pump Therapy Acceptable Alternative to Injection Therapy. Postgraduate Medicine, vol. 99, No. 3, pp. 125-142.

Reed J et al. (1996). Voice of the Diabetic, vol. 11, No. 3, pp. 1-38.

Skyler J S (1989). Continuous Subcutaneous Insulin Infusion [CSII] With External Devices: Current Status. Update in Drug Delivery Systems, Chapter 13, pp. 163-183. Futura Publishing Company.

Skyler J S et al. (1995). The Insulin Pump Therapy Book Insights from the Experts. MiniMed•Technologies.

Strowig S M (1993). Initiation and Management of Insulin Pump Therapy. The Diabetes Educator, vol. 19, No. 1, pp. 50-60.

Walsh J, et al. (1989). Pumping Insulin: The Art of Using an Insulin Pump. Published by MiniMed•Technologies.

(Intensive Diabetes Management, 1995). Insulin Infusion Pump Therapy. pp. 66-78.

(56) References Cited

OTHER PUBLICATIONS

Disetronic My Choice™ D-TRON™ Insulin Pump Reference Manual. (no date).
Disetronic H-TRON® plus Quick Start Manual. (no date).
Disetronic My Choice H-TRONplus Insulin Pump Reference Manual. (no date).
Disetronic H-TRON®plus Reference Manual. (no date).
(MiniMed, 1996). The MiniMed 506, 7 pages. Retrieved on Sep. 16, 2003 from the World Wide Web: http://web.archive.org/web/19961111054527/www.minimed.com/files/506_pic.htm.
(MiniMed. 1997). MiniMed 507 Specifications. 2 pages. Retrieved on Sep. 16, 2003 from the World Wide Web: http://web.archive.org/web/19970124234841/www.minimed.com/files/mmn075.htm.
(MiniMed, 1996). FAQ: The Practical Things . . . pp. 1-4. Retrieved on Sep. 16, 2003 from the World Wide Web: http://web.archive.org/web/19961111054546/www.minimed.com/files/faq_pract.htm.
(MiniMed, 1997). Wanted: a Few Good Belt Clips! 1 page. Retrieved on Sep. 16, 2003 from the World Wide Web: http://www.web.archive.org/web/19970124234559/www.minimed.com/files/mmn002.htm.
(MiniMed Technologies, 1994). MiniMed 506 Insulin Pump User's Guide.
(MiniMed Technologies, 1994). MiniMed™ Dosage Calculator Initial Meal Bolus Guidelines / MiniMed™ Dosage Calculator Initial Basal Rate Guidelines Percentage Method. 4 pages.
(MiniMed, 1996). MiniMed™ 507 Insulin Pump User's Guide.
(MiniMed, 1997). MiniMed™ 507 Insulin Pump User's Guide.
(MiniMed, 1998). MiniMed 507C Insulin Pump User's Guide.
(MiniMed International, 1998). MiniMed 507C Insulin Pump for those who appreciate the difference.
(MiniMed Inc., 1999). MiniMed 508 Flipchart Guide to Insulin Pump Therapy.
(MiniMed Inc., 1999). Insulin Pump Comparison / Pump Therapy Will Change Your Life.
(MiniMed, 2000). MiniMed® 508 User's Guide.
(MiniMed Inc., 2000). MiniMed® Now [I] Can Meal Bolus Calculator / MiniMed® Now [I] Can Correction Bolus Calculator.
(MiniMed Inc., 2000). Now [I] Can MiniMed Pump Therapy.
(MiniMed Inc., 2000). Now [I] Can MiniMed Diabetes Management.
(Medtronic MiniMed, 2002). The 508 Insulin Pump A Tradition of Excellence.
(Medtronic MiniMed, 2002). Medtronic MiniMed Meal Bolus Calculator and Correction Bolus Calcualtor. International Version.
Abel, P., et al., "Experience with an implantable glucose sensor as a prerequiste of an artificial beta cell," Biomed. Biochim. Acta 43 (1984) 5, pp. 577-584.
Bindra, Dilbir S., et al., "Design and in Vitro Studies of a Needle-Type Glucose Sensor for a Subcutaneous Monitoring." American Chemistry Society, 1991, 63, pp. 1692-1696.
Boguslavsky, Leonid, et al., "Applications of redox polymers in biosensors." Sold State Ionics 60, 1993, pp. 189-197.
Geise, Robert J., et al., "Electropolymerized 1,3-diaminobenzene for the construction of a 1,1'-dimethylferrocene mediated glucose biosensor," Analytica Chimica Acta, 281, 1993, pp. 467-473.
Gernet, S., et al., "A Planar Glucose Enzyme Electrode," Sensors and Actuators, 17, 1989, pp. 537-540.
Gernet, S., et al., "Fabrication and Characterization of a Planar Electromechanical Cell and its Application as a Glucose Sensor," Sensors and Actuators, 18, 1989, pp. 59-70.
Gorton, L., et al., "Amperometric Biosensors Based on an Apparent Direct Electron Transfer Between Electrodes and Immobilized Peroxiases," Analyst. Aug. 1991, vol. 117, pp. 1235-1241.
Gorton, L., et al., "Amperometric Glucose Sensors Based on Immobilized Glucose-Oxidizing Enymes and Chemically Modified Electrodes," Analytica Chimica Acta, 249, 1991, pp. 43-54.
Gough, D. A., et al., "Two-Dimensional Enzyme Electrode Sensor for Glucose," Analytical Chemistry, vol. 57, No. 5, 1985, pp. 2351-2357.
Gregg, Brian A., et al., "Cross-Linked Redox Geis Containing Glucose Oxidese for Amperometric Biosensor Applications," Analytical Chemistry, 62, pp. 258-263.
Gregg, Brian A., et al., "Redox Polymer Films Containing Enzymes. 1. A Redox-Conducting Epoxy Cement: Synthesis, Characterization, and Electrocatalytic Oxidation of Hydroquinone." The Journal of Physical Chemistry, vol. 95, No. 15, 1991, pp. 5970-5975.
Hashiguchi, Yasuhiro, MD, et al., "Development of a Miniaturized Glucose Monitoring System by Combining a Needle-Type Glucose Sensor With Microdialysis Sampling Method," Diabetes Care, vol. 17, No. 5, May 1994, pp. 387-389.
Hello, Adam, "Electrical Wiring of Redox Enzymes." Acc. Chem. Res., vol. 23, No. 5, May 1990, pp. 128-134.
Jobst, Gerhard, et al., "Thin-Film Microbiosensors for Glucose-Lactate Monitoring." Analytical Chemistry, vol. 66, No. 18, Sep. 15, 1996, pp. 3173-3179.
Johnson, K.W., et al., "In vivo evaluation of an electroenzymatic glucose sensor implanted in subcutaneous tissue," Biosensors & Bioelectronics, 7, 1992, pp. 709-714.
Jönsson, G., et al., "An Electromechanical Sensor for Hydrogen Peroxide Based on Peroxidase Adsorbed on a Spectrographic Graphite Electrode," Electroanalysis, 1989, pp. 465-468.
Kanapieniene, J. J., et al., "Miniature Glucose Biosensor with Extended Linearity." Sensors and Actuators, B, 10, 1992, pp. 37-40.
Kawamori, Ryuzo, et al., "Perfect Normalization of Excessive Glucagon Responses to Intraveneous Arginine in Human Diabetes Mellitus With the Artificial Beta-Cell," Diabetes vol. 29, Sep. 1980, pp. 762-765.
Kimura, J., et al., "An Immobilized Enzyme Membrane Fabrication Method," Biosensors 4, 1988, pp. 41-52.
Koudelka, M., et al., "In-vivo Behaviour of Hypodermically Implanted Microfabricated Glucose Sensors." Biosensors & Bioelectronics 6, 1991, pp. 31-36.
Koudelka, M., et al., "Planar Amperometric Enzyme-Based Glucose Microelectrode," Sensors & Actuators, 18, 1989, pp. 157-165.
Mastrototaro, John J., et al., "An electroenzymatic glucose sensor fabricated on a flexible substrate," Sensors & Actuators, B. 5, 1991, pp. 139-144.
Mastrototaro, John J., et al., "An Electroenzymatic Sensor Capable of 72 Hour Continuous Monitoring of Subcutaneous Glucose." 14th Annual International Diabetes Federation Congress, Washington D.C., Jun. 23-28, 1991.
McKean, Brian D., et al., "A Telametry-Instrumentation System for Chronically Implanted Glucose and Oxygen Sensors." IEEE Transactions on Biomedical Engineering, Vo. 35, No. 7, Jul. 1988, pp. 526-532.
Monroe, D., "Novel Implantable Glucose Sensors," ACL, Dec. 1989, pp. 8-16.
Morff, Robert J., et al., "Microfabrication of Reproducible, Economical, Electroenzymatic Glucose Sensors," Annuaal International Conference of teh IEEE Engineering in Medicine and Biology Society, Vo. 12, No. 2, 1990, pp. 483-484.
Moussy, Francis, et al., "Performance of Subcutaneously Implanted Needle-Type Glucose Sensors Employing a Novel Trilayer Coating," Analytical Chemistry, vol. 65, No. 15. Aug. 1, 1993, pp. 2072-2077.
Nakamoto, S., et al., "A Lift-Off Method for Patterning Enzyme-Immobilized Membranes in Multi-Biosensors," Sensors and Actuators 13, 1988, pp. 165-172.
Nishida, Kenro. et al., "Clinical applications of teh wearable artifical endocrine pancreas with the newly designed needle-type glucose sensor," Elsevier Sciences B.V., 1994, pp. 353-358.
Nishida, Kenro, et al., "Development of a ferrocene-mediated needle-type glucose sensor covered with newly designed biocompatible membrane, 2-methacryloxyethyethylphosphorylcholine-co-n-butyl nethacrylate," Medical Progress Through Technology, vol. 21, 1995, pp. 91-103.
Poitout, V., et al., "A glucose monitoring system for on line estimation oin man of blood glucose concentration using a miniturized glucose sensor implanted in the subcutaneous tissue adn a wearable control unit," Diabetologia, vol. 36, 1991, pp. 658-663.

(56) References Cited

OTHER PUBLICATIONS

Reach, G., "A Method for Evaluating in vivo the Funtional Characteristics of Glucose Sensors," Biosensors 2, 1986, pp. 211-220.
Shaw, G. W., et al., "In vitro testing of a simply contructed, highly stable glucose sensor suitable for implantation in diabetic patients," Biosensors & Bioelectronics 6, 1991, pp. 401-406.
Shichiri, M., "A Needle-Type Glucose Sensor—A Valuable Tool Not Only For a Self-Blood Glucose Monitoring but for a Wearable Artifiical Pancreas," Life Support Systems Proceedings, XI Annual Meeting ESAO, Alpbach-Innsbruck, Austria, Sep. 1984, pp. 7-9.
Shichiri, Motoaki, et al., "An artificial endocrine pancreas—problems awaiting solution for long-term clinical applications of a glucose sensor," Frontiers Med. Biol. Engng., 1991, vol. 3, No. 4, pp. 283-292.
Shichiri, Motoaki, et al., "Closed-Loop Glycemic Control with a Wearable Artificial Endocrine Pancreas—Variations in Daily Insulin Requirements to Glycemic Response," Diabetes, vol. 33, Dec. 1984, pp. 1200-1202.
Shichiri, Motoaki, et al., "Glycaemic Control in a Pacreatectomized Dogs with a Wearable Artificial Endocrine Pancreas," Diabetologia, vol. 24, 1983, pp. 179-184.
Shichiri, M., et al., "In Vivo Characteristics of Needle-Type Glucose Sensor—Measurements of Subcutaneous Glucose Concentrations in Human Volunteers," Hormone and Metabolic Research, Supplement Series vol. No. 20, 1988, pp. 17-20.
Shichiri, M., et al., "Membrane design for extending the long-life of an implantable glucose sensor," Diab. Nutr. Metab., vol. 2, No. 4, 1989, pp. 309-313.
Shichiri, Motoaki, et al., "Normalization of the Paradoxic Secretion of Glucagon in Diabetes Who Were Controlled by the Artificial Beta Cell," Diabetes, vol. 28, Apr. 1979, pp. 272-275.
Shichiri, Motoaki, et al., "Telemetry Glucose Monitoring Device with Needle-Type Glucose Sensor: A useful Tool for Blood Glucose Montoring in Diabetic Individuals," Diabetes Care, vol. 9, No. 3, May-Jun. 1986, pp. 298-301.
Shichiri, Motoaki, et al., "Wearable Artificial Endocrine Pancreas with Needle-Type Glucose Sensor," The Lancet, Nov. 20, 1982, pp. 1129-1131.
Shichiri, Motoaki, et al., "The Wearable Artificial Endocrine Pancreas with a Needle-Type Glucose Sensor. Perfect Glycemic Control in Ambulatory Diabetes," Acta Paediatr Jpn 1984, vol. 26, pp. 359-370.
Shinkai, Seiji, "Molecular Recognition of Mono- and Di-saccharides by Phenylboronic Acids in Solvent Extraction and as a Monolayer," J. Chem. Soc., Chem. Commun., 1991, pp. 1039-1041.
Shults, Mark C., "A Telemetry-Instrumentation System for Monitoring Multiple Subcutaneously Implanted Glucose Sensors," IEEE Transactions on Biomedical Engineering, vol. 41, No. 10, Oct. 1994, pp. 937-942.
Sternberg, Robert, et al., "Study and Development of Multilayer Needle-type Enzyme-based Glucose Microsensors," Biosensors, vol. 4, 1988, pp. 27-40.
Tamiya, E., et al., "Micro Glucose Sensors using Electron Mediators Immobilized on a Polypyrrole-Modified Electrode," Sensors and Actuators, vol. 18, 1989, pp. 297-307.
Tsukagoshi, Kazuhiko, et al., "Specific Complexation with Mono- and Disaccharides that can be Detected by Circular Dichroism," J. Org. Chem., vol. 56, 1991, pp. 4089-4091.
Urban, G., et al., "Miniaturized multi-enzyme biosensors integrated with pH sensors on flexible polymer carriers for in vivo application," Biosensors & Bioelectronics, vol. 7, 1992, pp. 733-739.
Urban, G., et al., "Miniaturized thin-film biosensors using covalently immobilized glucose oxidase," Biosensors & Bioelectronics, vol. 6, 1991, pp. 555-562.
Velho, G., et al., "In vivo calibration of a subcutaneous glucose sensor for determination of subcutaneous glucose kinetics," Diab. Nutr. Metab., vol. 3, 1988, pp. 227-233.
Wang, Joseph, et al., "Needle-Type Dual Microsensor for the Simultaneous Monitoring of Glucose and Insulin," Analytical Chemistry, vol. 73, 2001, pp. 844-847.
Yamasaki, Yoshimitsu, et al., "Direct Measurement of Whole Blood Glucose by a Needle-Type Sensor," Clinics Chimica Acta, vol. 93, 1989, pp. 93-98.
Yokoyama, K., "Integrated Biosensor for Glucose and Galactose," Analytica Chimica Acta, vol. 218, 1989, pp. 137-142.

* cited by examiner

DETECTING BREAKAGE IN A DISPLAY ELEMENT

TECHNICAL FIELD

Embodiments of the subject matter described herein relate generally to display elements, such as liquid crystal displays (LCDs). More particularly, embodiments of the subject matter relate to techniques and methodologies for checking the health and integrity of an LCD element of a host electronic device.

BACKGROUND

LCD and other display components are commonly used as display elements for electronic devices such as computers, mobile video games, cell phones, digital media players, medical devices, television monitors, and the like. One type of LCD technology uses an array of pixels that are driven by thin film transistors (this type of LCD is known as a TFT LCD). Activation of the thin film transistors can be controlled with an LCD controller, which may be integrally formed with the LCD component. A TFT LCD component is fabricated from thin glass layers, one of which serves as a substrate for the thin film transistors. The glass layers are prone to breakage when exposed to high stress or impact.

In some situations, the health or operating integrity of an LCD component can be compromised in a way that adversely affects the communication between the LCD controller and the main controller or processor of the host electronic device. In such situations, the main controller can detect or determine that communication with the LCD controller has been lost and initiate an appropriate alert or alarm sequence to warn the user. In another scenario, the health or operating integrity of an LCD component can be compromised in a way that adversely affects the operation of the pixel elements even though communication between the LCD controller and the main host device controller remains intact. Under such circumstances, the LCD controller continues to function as usual even though the integrity of the actual LCD pixels is compromised. This creates a situation where the host controller that communicates with the LCD controller continues to provide display instructions (without knowing that the LCD component is broken).

Accordingly, it is desirable to have a methodology and related circuitry to diagnose the operating health of an LCD component. In particular, it is desirable to have a system and methodology to detect when the health of an LCD component has been compromised in the manner described above, i.e., where the LCD controller remains functional and in communication with the controller of the host device. Furthermore, other desirable features and characteristics will become apparent from the subsequent detailed description and the appended claims, taken in conjunction with the accompanying drawings and the foregoing technical field and background.

BRIEF SUMMARY

The subject matter described herein relates to diagnostic procedures and related device architectures that check the operating health of an LCD element of a host electronic device. One or more of the methodologies presented herein can be utilized in an electronic device such as, without limitation, a fluid infusion device.

In accordance with an exemplary embodiment, an LCD apparatus for a host electronic device includes an LCD element, an LCD controller, and a conductive trace that is used to check the operating health of the LCD element. The LCD element includes an array of pixel elements formed overlying a substrate and arranged to define a viewable LCD area. The LCD controller is coupled to control activation of the array of pixel elements, and the LCD controller is formed overlying the substrate. The conductive trace is also formed overlying the substrate. The trace is arranged to bypass the LCD controller in a layout that does not interfere with visibility of the array of pixel elements. Detection of an electrical discontinuity in the conductive trace is indicative of a failure mode of the LCD element, and the integrity of the conductive trace is monitored by a detection circuit associated with the host electronic device.

In accordance with an exemplary embodiment, an LCD apparatus for a host electronic device includes an LCD element having an array of pixel elements formed overlying a substrate and arranged to define a viewable LCD area. The LCD apparatus also includes an LCD controller coupled to control activation of the array of pixel elements. The LCD controller is formed overlying the substrate. The LCD apparatus also includes a conductive trace formed overlying the substrate and arranged to bypass the LCD controller in a layout that does not interfere with visibility of the array of pixel elements. A detection circuit is coupled to the conductive trace, and the detection circuit operates to check electrical continuity of the conductive trace to obtain an indication of health of the LCD element.

Also presented herein is an exemplary embodiment of a method of checking health of an LCD apparatus of a host electronic device. The LCD apparatus includes an array of pixel elements formed overlying a substrate, an LCD controller formed overlying the substrate and coupled to control activation of the array of pixel elements, and a conductive trace formed overlying the substrate and arranged to bypass the LCD controller in a layout that does not interfere with visibility of the array of pixel elements. The method begins by entering a diagnostic health check mode for the host electronic device. The method continues by testing electrical continuity of the conductive trace during the diagnostic health check mode to obtain a continuity status. When the continuity status indicates an electrical discontinuity in the conductive trace, an alert is generated for a user of the host electronic device. The alert indicates that the LCD apparatus requires service.

An exemplary embodiment of electronic device is also disclosed herein. The electronic device includes a display element, a display controller coupled to the display element to control operation of the display element, and a host controller coupled to the display controller. The display controller provides display commands to the display controller. The host controller functions in a diagnostic health check mode to obtain operating current of the display element associated with display of a test image by the display element, compare the obtained operating current against acceptance criteria for the test image, and initiate an alerting action when the obtained operating current does not satisfy the acceptance criteria.

A method of checking health of a display element of a host electronic device is also disclosed herein. An exemplary embodiment of the method begins by entering a diagnostic health check mode for the host electronic device. The method continues by controlling the display element to display a test image while operating in the diagnostic health check mode, and by measuring operating current of the display element, the measured operating current associated with display of the test image. The measured operating current is compared against acceptance criteria for the test image, and an alerting action is initiated when the measured operating current does not satisfy the acceptance criteria.

Another method of checking health of a display element of a host electronic device is also disclosed herein. An exemplary embodiment of the method begins by receiving an instruction to wake up the display element from a standby state. After the instruction is processed, the display element is activated and controlled to display an initial image. The operating current of the display element is measured while the initial image is being displayed. The method continues by determining whether the measured operating current is indicative of a failure mode of the display element. An alert is generated with an alerting component (other than the display element) when the measured operating current is determined to be indicative of the failure mode.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
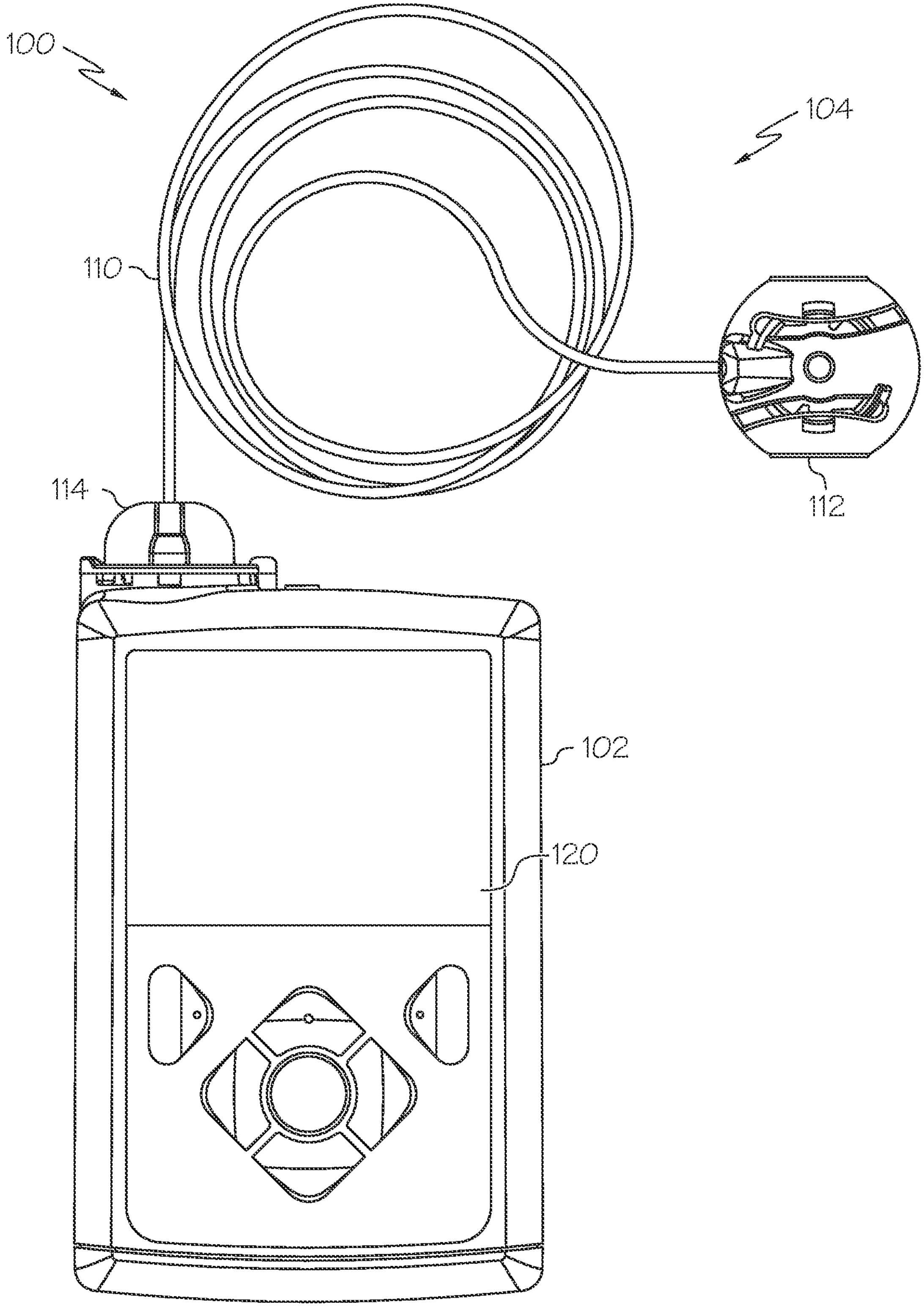
FIG. 1 is a plan view of an exemplary embodiment of a fluid delivery system that includes a fluid infusion device and an infusion set.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The subject matter described here relates to display elements of the type used in electronic devices to display content (images, videos, data, indicators, or the like) to a user. Although certain exemplary embodiments utilize LCD elements as the display component, the techniques and technologies described herein can also be implemented for use with other types of displays, such as: light-emitting diode (LED), passive LCD, organic light-emitting diode (OLED), plasma, and the like. It should be understood that the diagnostic methodologies described in detail below can be leveraged for use with any compatible display technology if so desired.

In accordance with some embodiments, the host electronic device is realized as a fluid infusion system of the type used to treat a medical condition of a patient. The fluid infusion system is used for infusing a medication fluid into the body of a user, and the LCD element can be used to display information, instructions, lock screens, confirmation screens, tutorials, and the like. The non-limiting examples described below relate to a medical device used to treat diabetes (more specifically, an insulin pump), although embodiments of the disclosed subject matter are not so limited. Indeed, the LCD diagnostics described in detail herein can be utilized in the context of any suitably configured host electronic device.

Techniques and technologies may be described herein in terms of functional and/or logical block components, and with reference to symbolic representations of operations, processing tasks, and functions that may be performed by various computing components, devices, or microcontrollers. Such operations, tasks, and functions are sometimes referred to as being computer-executed, computerized, software-implemented, or computer-implemented. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to LCD design, manufacturing, and operation may not be described in detail herein. Indeed, the subject matter presented herein can leverage any known or conventional LCD technology (in particular, TFT LCD technology). Those familiar with the design and manufacturing of LCD components will understand how the various LCD diagnostic techniques described herein can be deployed and utilized in connection with otherwise conventional TFT LCD technology.

FIG. 1 is a plan view of an exemplary embodiment of a fluid delivery system 100, which can be utilized to administer a medication fluid such as insulin to a patient. The fluid delivery system 100 includes a fluid infusion device 102 (e.g., an infusion pump) and a fluid conduit assembly 104 that is coupled to, integrated with, or otherwise associated with the fluid infusion device 102. The fluid infusion device 102 is operated in a controlled manner to deliver the medication fluid to the user via the fluid conduit assembly 104. The fluid infusion device 102 may be provided in any desired configuration or platform. In accordance with one non-limiting embodiment, the fluid infusion device 102 is realized as a portable unit that can be carried or worn by the patient.

The fluid conduit assembly 104 includes, without limitation: a tube 110; an infusion unit 112 coupled to the distal end of the tube 110; and a connector assembly 114 coupled to the proximal end of the tube 110. The fluid infusion device 102 is designed to be carried or worn by the patient, and the fluid conduit assembly 104 terminates at the infusion unit 112 such that the fluid infusion device 102 can deliver fluid to the body of the patient via the tube 110. The fluid conduit assembly 104 defines a fluid flow path that fluidly couples a fluid reservoir (located inside the fluid infusion device and, therefore, not shown in FIG. 1) to the infusion unit 112. The connector assembly 114 mates with and couples to the fluid reservoir, establishing the fluid path from the fluid reservoir to the tube 110. The connector assembly 114 (with the fluid reservoir coupled thereto) is coupled to the housing of the fluid infusion device 102 to seal and secure the fluid reservoir inside the housing. Thereafter, actuation of the fluid infusion device 102 causes the medication fluid to be expelled from the fluid reservoir, through the fluid conduit assembly 104, and into the body of the patient via the infusion unit 112 at the distal end of the tube 110.

The fluid infusion device 102 includes at least one display element 120 that is controlled to display content to the user, such as device status information, glucose data for the patient, operating instructions, messages, alerts, or the like. Although not always required, the embodiment described here includes only one display element 120. The shape, size, orientation, and pixel resolution of the display element 120 may be chosen to suit the needs of the particular implementation. In this regard, a practical implementation of the fluid infusion device 102 can utilize a display element 120 having a resolution of 320×240 pixels (QVGA resolution), although other resolutions can be used if so desired. For the exemplary embodiment described herein, the display element 120 includes an LCD component that is controlled in an appropriate manner using the native processing capabilities of the fluid infusion device 102 (which is the host electronic device for the LCD component and its LCD controller). In this regard, the fluid infusion device 102 can include a main or primary host controller, which controls the various functions and operations of the fluid infusion device.

Figure 2:
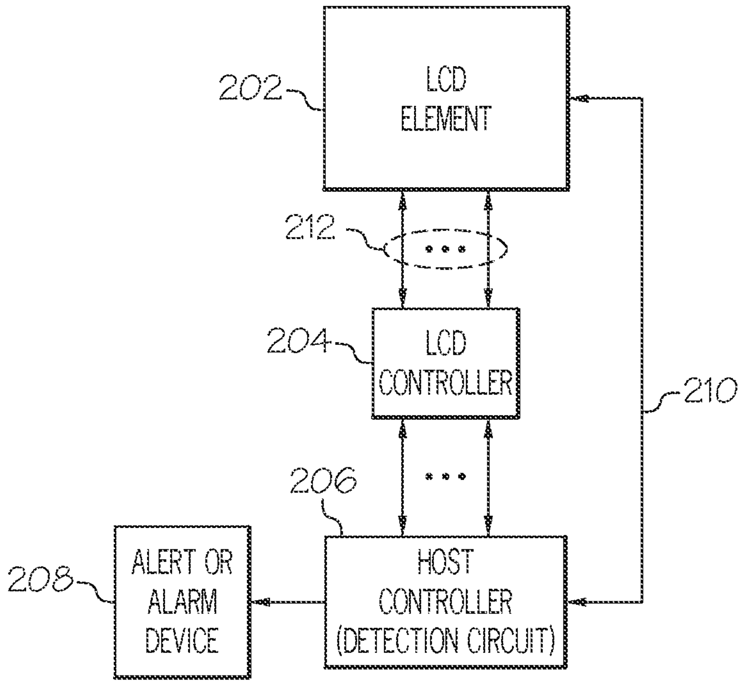
FIG. 2 is a schematic representation of an LCD apparatus of an electronic device, along with related control modules.

FIG. 2 is a schematic representation of an LCD apparatus of an electronic device, along with related control modules. The elements depicted in FIG. 2 can be utilized in the fluid infusion device 102 described above. The simplified arrangement depicted in FIG. 2 includes an LCD element 202, an LCD controller 204, a host controller 206, and an alert or alarm device, component, or element (referred to herein as an alerting component 208). FIG. 2 also depicts a conductive sensor trace 210, which can be implemented in certain embodiments (as described in more detail below).

The LCD controller 202 and the host controller 206 can each be realized as a microcontroller device, an application-specific integrated circuit (ASIC), a microprocessor device, or any processor-based component that is suitably designed and programmed to execute the necessary functions and operations. Although the LCD controller 202 is preferably configured to support the functionality of the LCD element 202, it can also be designed to support other features or functions if so desired. Similarly, the host controller 206 can be designed, configured, and programmed to support any number of features, functions, and operations of the host electronic device.

The LCD element 202 and the LCD controller 204 can be fabricated together as an integrated assembly, e.g., residing on a common substrate or device platform. In this regard, an LCD apparatus or component of the host electronic device can include both the LCD element 202 and the LCD controller 204. In alternative embodiments, the LCD controller 204 can be implemented in a manner that is physically distinct from the LCD element 202, e.g., as a distinct component mounted to another circuit board, or as a logical module of a different microcontroller or processor. The LCD element 202 includes an array of pixel elements formed overlying a substrate, in accordance with established and conventional LCD technologies. The pixel elements are designed, configured, and arranged to define a viewable LCD area, which in turn represents the visible display screen of the host device. In this regard, FIG. 4 depicts a portion of an LCD substrate 404 having four pixel elements 406 formed thereon.

The LCD controller 204 is operatively coupled to the LCD element 202 to control the activation of the array of pixel elements. More specifically, the LCD controller 204 operates to selectively activate the individual pixel elements as needed to produce the intended display content. In certain embodiments, the LCD controller 204 resides on the same substrate as the LCD element 202. In other words, the LCD controller 204 can be formed overlying the LCD substrate. In accordance with conventional LCD technology, the LCD controller 204 controls the activation of the pixel elements via a plurality of conductive signal traces, lines, or wires, which serve as electrical address lines 212. The address lines 212 provide voltage levels to the transistors of the LCD element 202. More specifically, the address lines 212 apply the designated source and gate voltages to the transistors associated with the pixel elements, and the drains of the transistors form the electrodes that electrically drive the liquid crystal. The LCD controller 204 controls the activation of the array of pixel elements using an appropriate addressing scheme to control the on/off status of each transistor in the LCD element 202.

Figure 4:
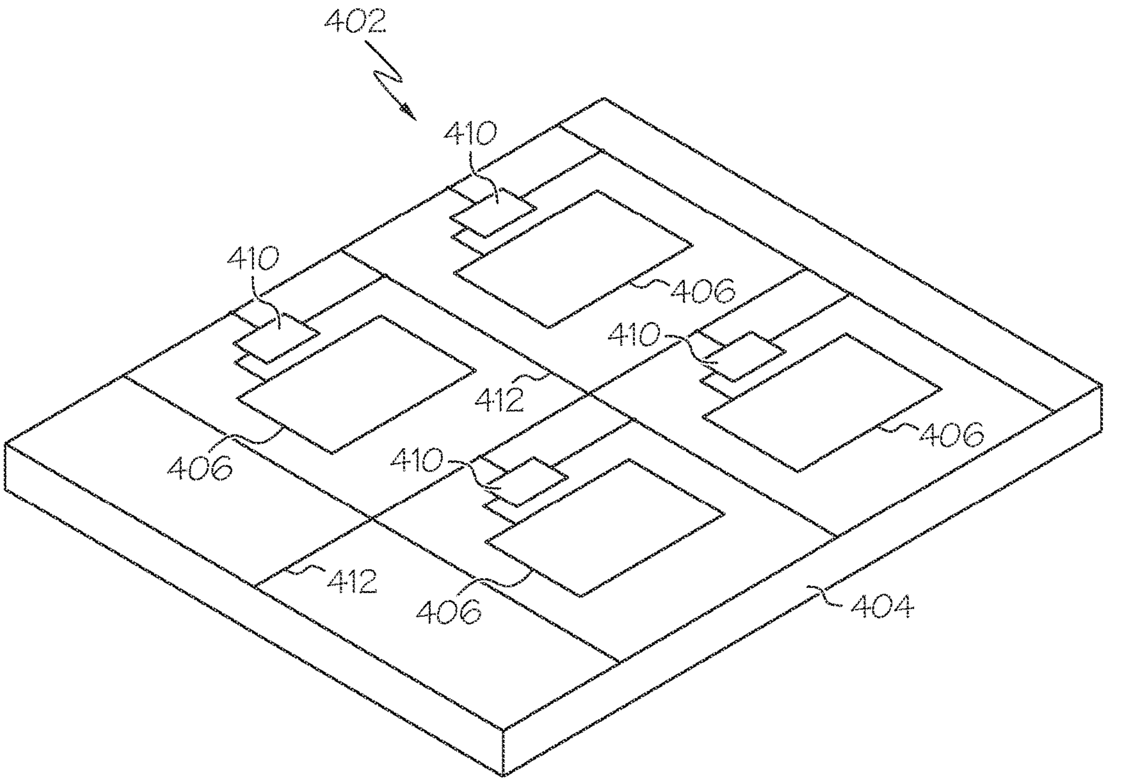
FIG. 4 is a simplified perspective view of a portion of an LCD substrate.

Referring now to FIG. 4, a portion of an exemplary LCD substrate 404 is shown. FIG. 4 shows four pixel elements 406 of an LCD element 402 (in reality, the LCD element 402 will have many more pixel elements 406 arranged in multiple rows and columns). Each pixel element 406 has an associated control transistor 410 formed overlying the LCD substrate 404, and the transistors 410 are activated by way of electrical address lines 412. Referring again to FIG. 2, the address lines 212 can be assigned to the electrical address lines 412 as needed. As mentioned above, the LCD controller 204 employs an appropriate addressing scheme to apply the activation voltages to the relevant terminals of the transistors 410, in accordance with the desired image that is to be rendered on the LCD element 402.

Referring again to FIG. 2, for the illustrated embodiment, the LCD controller 204 receives commands and instructions from the host controller 206. The host controller 206 represents the main or primary processing component of the host electronic device. For this particular embodiment, the host controller 206 is suitably configured to provide display commands to the LCD controller 204. The display commands are processed by the LCD controller 204 to generate the required transistor activation voltages for the LCD pixel elements. The host controller 206 can include or cooperate with one or more detection circuits (hereinafter referred to in the singular form for ease of description) that monitor, test, and/or diagnose the operating health of the LCD element 202. The detection circuit can include electronic components (e.g., resistors, a gain element or amplifier, a voltage comparator, switches, or the like) and/or suitably configured processing logic to determine the operating integrity of the LCD element 202 as needed. Specific methodologies for checking the health of the LCD element 202 are presented in more detail below.

The alerting component 208 is controlled to generate alerts, alarms, messages, or indications intended for the user of the host electronic device. Notably, the alerting component 208 is peripheral to, and independent of, the LCD element 202. This allows the alerting component 208 to generate alerts or warnings in situations where the LCD element 202 has failed or is damaged. In certain embodiments, the alerting component 208 is operatively coupled to the host controller 206 and is operated independently of the LCD element 202. The host controller 206 can activate the alerting component 208 as needed to initiate alerting actions associated with the detection of a damaged, failed, or compromised LCD element 202. The alerting component 208 can be realized as one or more of the following, without limitation: an indicator light; a display element other than the LCD element 202; a speaker or other type of sound-generating transducer; or a haptic feedback element. Regardless of the form or mode of alerting used by the host electronic device, the alerting component 208 can be controlled to generate an appropriate alert, alarm, or message when the detection circuit detects a problem with the LCD element 202.

Display Element Health Monitoring Using Sensor Trace

Figure 3:
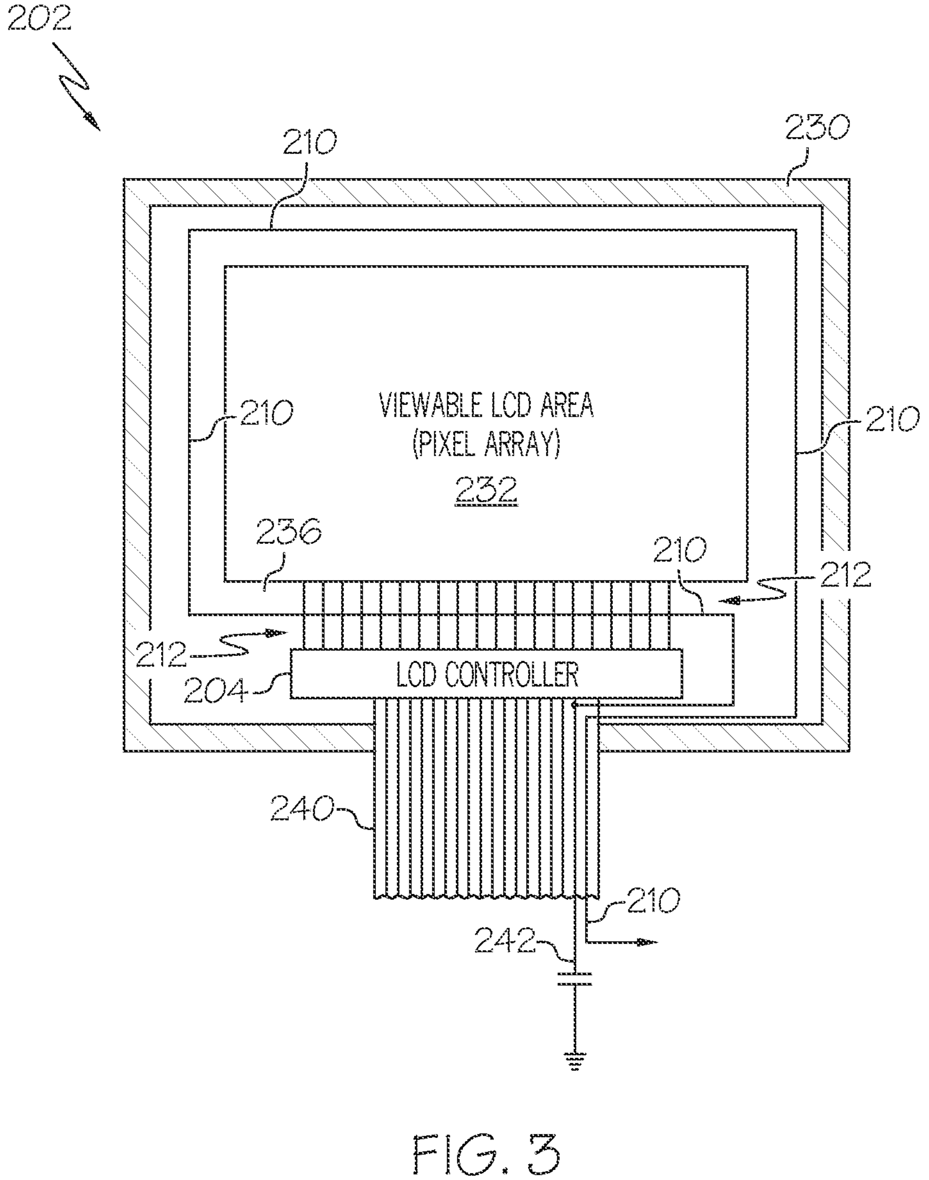
FIG. 3 is a schematic plan view of an exemplary embodiment of an LCD element having a health detection trace integrated therein.

This section describes one exemplary methodology for detecting the type of LCD failure that results in a compromised display even though communication between the LCD controller 204 and the host controller 206 remains intact. Referring to FIG. 2 and FIG. 3, this methodology employs the conductive sensor trace 210, which runs from the detection circuit of the host electronic device (e.g., from the host controller 206) and into at least a section of the LCD element 202. Electrical continuity of the conductive sensor trace 210 can be tested to indicate whether or not the LCD element 202 is cracked or broken. More specifically, a detected discontinuity in the conductive sensor trace 210 indicates that the glass substrate of the LCD element 202 is cracked or broken. Conversely, if the conductive sensor trace 210 is intact and continuous, then the detection circuit assumes that the LCD element 202 is intact and operating as intended.

FIG. 3 depicts an implementation of the LCD element 202 that is supported by a physical frame 230 or other support structure. The viewable LCD area 232 as defined by the array of pixel elements is positioned inside of the frame 230. The areas outside of the viewable LCD area 232 are considered to be non-viewable areas of the LCD element 202 because those regions are not associated with the rendering of any displayed content. For the exemplary embodiment shown in FIG. 3, the electrical address lines 212 (which are used by the LCD controller 204 to control the activation of the pixel elements) traverse a non-viewable area 236 that is located between the array of pixel elements and the LCD controller 204. In FIG. 3, the electrical address lines 212 are the short vertical lines that connect the LCD controller 204 to the viewable LCD area 232, and the non-viewable area 236 generally corresponds to the space below the viewable LCD area 232 and above the LCD controller 204.

It should be appreciated that the viewable LCD area 232 includes many pixel elements, rows of electrical address lines 212, and columns of electrical address lines 212. The pixel elements are arranged in rows and columns, along with their corresponding control transistors, as shown in the simplified rendering of FIG. 4. In accordance with established and conventional transistor manufacturing methodologies, the electrical address lines 412 are formed on different layers such that the rows and columns of electrical address lines 412 are insulated from each other as needed.

Moreover, as shown in FIG. 4, the electrical address lines 412 are arranged in the space between the pixel elements 406 such that the electrical address lines 412 do not interfere with the displayed images created by the pixel elements 406. In other words, the electrical address lines 412 are formed overlying areas of the LCD substrate 404 that are not occupied by the pixel elements.

The LCD element 202 may include or be attached to a flexible ribbon cable 240 that serves as a connection between the LCD controller 204 and the host controller 206 (not shown in FIG. 3). The cable 240 includes a plurality of conductive lines, traces, or wires that enable the host controller 206 to send instructions, commands, and/or control signals to the LCD controller 204. For this particular embodiment, the cable 240 also accommodates a portion of the conductive sensor trace 210. In this regard, one end of the conductive sensor trace 210 is connected to a ground lead 242 of the cable 240. The actual ground connection can be established at the host controller 206 or at any convenient location of the host electronic device. Thus, one end of the conductive sensor trace 210 corresponds to a ground voltage of the host electronic device. Although not always required, the ground lead 242 can serve as one grounding point for the LCD controller 204. As shown in FIG. 3, the other end of the conductive sensor trace 210 is routed through the cable 240 for connection with the detection circuit of the host electronic device.

FIG. 3 depicts one suitable layout and arrangement for the conductive sensor trace 210. It should be appreciated that the path of the conductive sensor trace 210 can be altered as needed to suit the needs of the particular embodiment. For the illustrated embodiment, the conductive sensor trace 210 is formed overlying the LCD substrate and is arranged in a layout that bypasses the LCD controller 204. In other words, the electrical path of the conductive sensor trace 210 does not depend on the operating state or status of the LCD controller 204. The conductive sensor trace 210 can be formed overlying the same LCD substrate that serves as the foundation for the pixel control transistors and for the electrical address lines 212. This ensures that the conductive sensor trace 210 can reliably detect when the LCD substrate cracks or is broken in the failure mode described herein.

Moreover, the conductive sensor trace 210 is preferably arranged in a layout that does not interfere with the visibility of the array of pixel elements. To this end, the conductive sensor trace 210 can be located outside of the viewable LCD area 232, as depicted in FIG. 3. Following the path of the conductive sensor trace 210 from the rightmost edge of the cable 240, the path is routed around the perimeter of the viewable LCD area, and a portion of the conductive sensor trace 210 is arranged overlying the non-viewable area 236. Although the conductive sensor trace 210 appears to intersect the electrical address lines 212 that traverse the non-viewable area 236, at least one layer of insulating material resides between the conductive sensor trace 210 and the electrical address lines 212. In other words, the conductive sensor trace 210 runs above or below the electrical address lines 212, separated by at least one dielectric layer. The three-dimensional aspect of these different layers is not discernable in FIG. 3.

Positioning the conductive sensor trace 210 overlying and across the electrical address lines 212 is desirable to effectively detect when the electrical address lines 212 might be compromised. In this regard, if the glass substrate breaks or cracks at or near the non-viewable area 236 in a way that severs some or all of the electrical address lines 212, then it is highly likely that the conductive sensor trace 210 will also be severed. This allows the detection circuit to respond even though communication with the LCD controller 204 remains intact.

In certain embodiments, the conductive sensor trace 210 can be routed within the viewable LCD area 232, but in a way that does not interfere with the visibility of the pixel elements. For example, the conductive sensor trace 210 can be arranged such that at least a portion of it is located between adjacent columns of the pixel elements (and formed on a layer that does not interfere with the electrical operation of the transistor address lines). As another example, the conductive sensor trace 210 can be arranged such that at least a portion of it is located between adjacent rows of the pixel elements (and formed on a layer that does not interfere with the electrical operation of the transistor address lines). Routing the conductive sensor trace 210 between the pixel elements is desirable to allow the detection circuit to detect LCD substrate breakage across more of the viewable LCD area 232.

Figure 5:
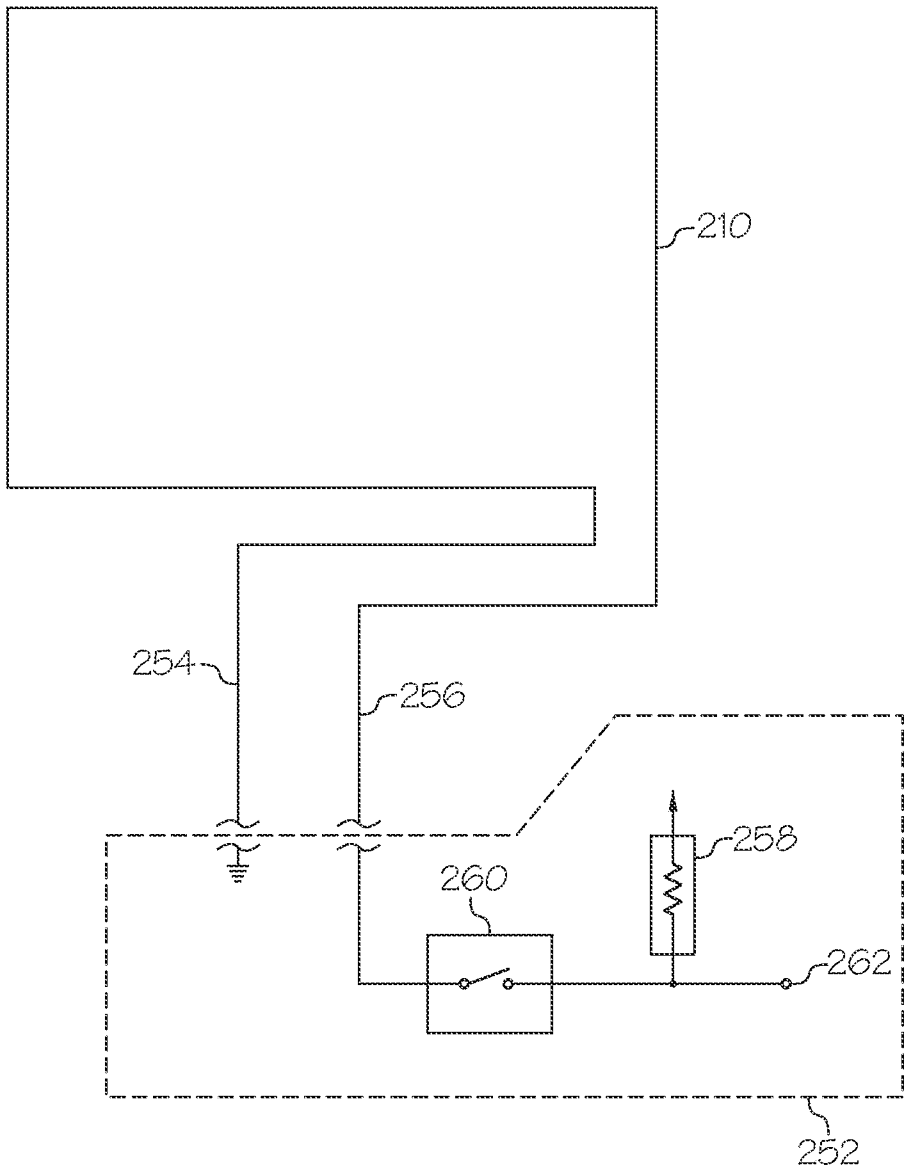
FIG. 5 is a simplified circuit schematic that includes an LCD health detection trace and related detection circuit components.

FIG. 5 is a simplified circuit schematic that includes the conductive sensor trace 210 shown as an isolated trace (rather than connected to the cable 240). FIG. 5 also shows an exemplary embodiment of a detection circuit 252, which may be implemented in the host controller 206 of the electronic device. The integrity (electrical and/or conductive integrity) of the conductive sensor trace 210 is monitored by the detection circuit 252, wherein detection of an electrical discontinuity in the conductive sensor trace 210 is indicative of a failure mode of the LCD element 202. Thus, the detection circuit 252 operates to check the electrical continuity of the conductive sensor trace 210 to obtain an indication of the health of the LCD element 202.

As mentioned above, a first end 254 of the conductive sensor trace 210 corresponds to a ground voltage of the host electronic device. For this version of the detection circuit 252, a second end 256 of the conductive sensor trace 210 is coupled to a pull-up resistor 258 via a switch 260. The switch 260 is actuated as needed to support a diagnostic health check mode for the host electronic device. More specifically, the switch 260 is open most of the time (during normal operation of the host electronic device). During the diagnostic health check mode, however, the switch 260 is closed to connect the pull-up resistor 258 for purposes of testing the continuity of the conductive sensor trace 210. When the switch 260 is closed, the voltage at the terminal 262 is measured. If the conductive sensor trace 210 is intact, then current will flow through the pull-up resistor 258 and there will be a voltage drop across the pull-up resistor 258. Thus, if the voltage measured at the terminal 262 is within the range of expected values, then the host controller 206 assumes that the LCD element 202 is intact and operational. In contrast, if the conductive sensor trace 210 is severed or has one or more electrical discontinuities, then little to no current will flow through the pull-up resistor 258, and the voltage measured at the terminal 262 will be virtually equal to the pull-up voltage. This voltage condition can be detected by the host controller 206 to initiate an alert/alarm state. In an equivalent manner, the detection circuit 252 can measure or obtain the electrical current flowing in the conductive trace during the diagnostic health check operation, either directly or based on the voltage measured at the terminal 262.

It should be appreciated that the detection circuit 252 can employ a current source as another option to test the current flowing in the conductive sensor trace 210 as needed. The pull-up resistor methodology, however, is an easy and reliable solution.

Figure 6:
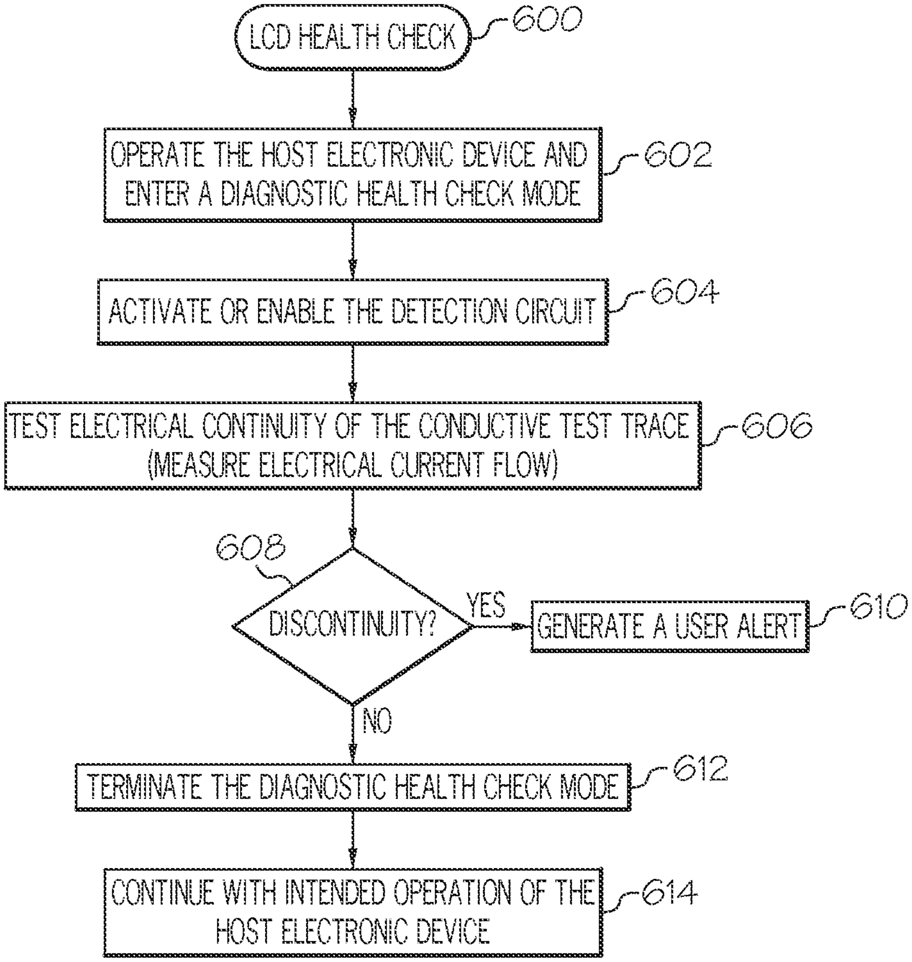
FIG. 6 is a flow chart that illustrates an exemplary embodiment of an LCD health check process.

FIG. 6 is a flow chart that illustrates an exemplary embodiment of an LCD health check process 600. The various tasks performed in connection with the process 600 may be performed by software, hardware, firmware, or any combination thereof. For illustrative purposes, the following description of the process 600 may refer to elements mentioned above in connection with FIGS. 1-5. It should be appreciated that the process 600 may include any number of additional or alternative tasks, the tasks shown in FIG. 6 need not be performed in the illustrated order, and the process 600 may be incorporated into a more comprehensive procedure or process having additional functionality not described in detail herein. Moreover, one or more of the tasks shown in FIG. 6 could be omitted from an embodiment of the process 600 as long as the intended overall functionality remains intact.

The process 600 assumes that the host electronic device includes a conductive sensor trace of the type previously described herein. The process 600 operates the host electronic device and enters a diagnostic health check mode (task 602). The diagnostic health check mode can be entered at any appropriate time. For example, a diagnostic LCD health check can be performed whenever the host device is turned on, whenever the display wakes up, and/or periodically according to a predetermined schedule. While in the diagnostic mode, the process 600 activates or enables the detection circuit that is used to check the health of the LCD (task 604). Referring to FIG. 5, enabling the detection circuit 252 involves the closing of the switch 260 to connect the pull-up resistor 258 to the conductive sensor trace 210.

After enabling the detection circuit, the process 600 continues by testing the electrical continuity of the conductive sensor trace (task 606). The test is performed during operation in the diagnostic health check mode to obtain a continuity status of the conductive sensor trace. As mentioned above, task 606 may involve the measurement of a voltage level and/or the measurement of electrical current flowing in the conductive trace to obtain measured test current. If the continuity status indicates an electrical discontinuity in the conductive sensor trace (the "Yes" branch of query task 608), then the process generates an alert for a user of the host electronic device, wherein the alert indicates that the LCD apparatus requires service, attention, repair, or the like (task 610). The check performed at query task 608 may compare the measured voltage/current against a threshold value that is indicative of an electrical discontinuity in the conductive sensor trace, or it may compare the measured voltage/current against a threshold value that is indicative of electrical continuity (i.e., an intact conductive sensor trace).

If the continuity status indicates electrical continuity in the conductive sensor trace (the "No" branch of query task 608), then the process 600 terminates the diagnostic health check mode (task 612) and continues with the intended operation of the host electronic device (task 614). For this particular embodiment, termination of the diagnostic health check mode involves opening the switch 260 to disconnect the conductive sensor trace 210 from the pull-up voltage source.

Display Element Health Monitoring Based on Operating Current

This section describes another exemplary methodology for detecting the type of LCD failure that results in a compromised display even though communication between the LCD controller 204 and the host controller 206 remains intact. In accordance with this methodology, the operating current of the LCD element 202 is monitored as a way to diagnose the health of the LCD element 202. In this regard, the LCD element 202 can be characterized to define a normal or expected range of operating current and to define another range of operating current that is indicative of a failed, damaged, or compromised state. The host controller of the electronic device is responsible for measuring and interpreting the operating current and, therefore, can generate an appropriate alert or alarm in response to a detected failure condition.

Figure 7:
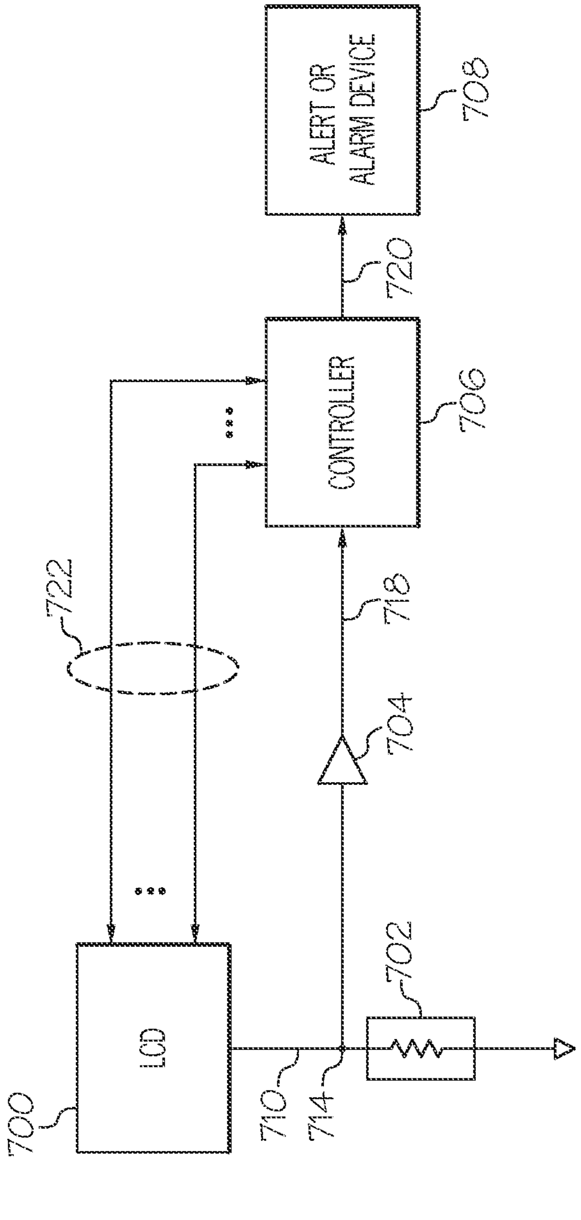
FIG. 7 is a schematic representation that illustrates another methodology for checking the health of an LCD component.

FIG. 7 is a schematic representation that illustrates another methodology for checking the health of an LCD component 700. FIG. 7 shows additional elements and features of the host electronic device: a grounding resistor 702; a voltage amplifier 704; a monitoring controller 706; and an alerting component 708. The grounding resistor 702 couples the ground terminal(s) 710 of the LCD component 700 to the system ground potential. FIG. 7 shows only one ground terminal 710 for the LCD component 700. In practice, the LCD component 700 can include a plurality of ground terminals or leads, as appropriate to the particular implementation. The current monitoring scheme depicted in FIG. 7 assumes that all ground terminals/leads are considered such that the total overall operating current of the LCD component 700 can be measured. Although the actual operating current may vary from one embodiment to another, the example presented here assumes an operating current of about 3-10 mA.

The grounding resistor 702 has a relatively low resistance, such that it does not adversely impact the operation of the LCD component 700. In certain embodiments, the grounding resistor 702 has a resistance within the range of about 400-700 mΩ. During operation of the LCD component 700, the voltage at the node 714 will be directly proportional to the overall operating current of the LCD component 700. The differences in the current levels monitored by the controller 706 can be relatively low. Accordingly, the voltage amplifier 704 amplifies the voltage present at the node 714 to a manageable level, which is then used as an analog input to the controller 706. In certain embodiments, the voltage amplifier 704 has a gain of about 100-250, which is suitable for the normally expected voltage present at the node 714 during operation of the LCD component 700. It should be understood that these exemplary values for the resistance and voltage gain are based on an embodiment where the LCD operating current falls within the range of about 3-10 mA, and where the monitoring controller 706 employs a 10-bit analog-to-digital converter. Moreover, the exemplary embodiment of the monitoring controller 706 has a reference voltage of 1.8 volts or 3.0 volts. Alternative values for the grounding resistor 702 and the gain of the voltage amplifier 704 are also contemplated, as appropriate to the particular embodiment.

In certain embodiments, the monitoring controller 706 is implemented with the host controller 206 (see FIG. 2). In other words, the functionality of the monitoring controller 706 is integrated in the host controller 206. This description assumes that the monitoring controller 706 and the host controller 206 are one and the same. In other embodiments, the monitoring controller 706 can be a distinct and separate microcontroller device that operates independently of the host controller 206 to perform the LCD monitoring functions described herein. The monitoring controller 706 includes an analog voltage input that receives the output voltage 718 produced by the voltage amplifier 704. The monitoring controller 706 can generate an output 720 to initiate an alert or alarm action as needed. In this regard, the monitoring controller 706 cooperates with the alerting component 708 to generate an appropriate alert, message, alarm, or other type of feedback to warn the user of the host electronic device when the monitoring controller 706 detects a potential problem with the LCD component 700. The alerting component 708 can be implemented in any of the forms described above with reference to the alerting component 208. In certain embodiments, the alerting component 708 is operated independently of the LCD element such that activation of the alerting component 708 can be achieved regardless of the operating status of the LCD component 700.

As mentioned above, the monitoring controller 706 shown in FIG. 7 also includes the functionality of the host controller. Accordingly, FIG. 7 shows the monitoring controller 706 coupled to the LCD component 700 via communication lines 722. The communication lines 722 enable the monitoring controller 706 to provide display instructions to the LCD component 700. When operating in the diagnostic health check mode, the monitoring controller 706 provides display instructions to the LCD component 700 and obtains a corresponding measure of the operating current of the LCD element. The display instructions cause the LCD element to display a "test image" for purposes of obtaining the valid range of operating current of the LCD element. Notably, the test image need not be a special display, pattern, or screen that is used only for diagnostic LCD testing (although it could be). Indeed, in certain embodiments the test image used during the diagnostic health check mode can be a wake-up screen that is ordinarily used by the host electronic device. In accordance with other embodiments, the test image can be one or more of the following, without limitation: a splash screen of the electronic device; a lock screen of the electronic device; a home page/screen for the user of the electronic device; a menu screen; a solid color display (e.g., black, white, gray, or any color); a test pattern screen; a particular image or picture; or a specially calibrated display utilized only for the diagnostic LCD health check procedure.

The monitoring controller 706 is suitably configured to compare the obtained, measured, or calculated operating current of the LCD component 700 against acceptance criteria that is maintained for the particular test image that is displayed to produce the obtained operating current. The monitoring controller 706 initiates an alerting action (e.g., activating the alerting component 708) when the operating current does not satisfy the stated acceptance criteria. In certain implementations, the acceptance criteria is defined to be a threshold value that is based on pre-characterized LCD element operating current. In some implementations, the acceptance criteria is defined to be an operating current range that is based on pre-characterized LCD element operating current. To this end, a number of instantiations of the LCD component 700 are empirically tested to determine their operating current behavior in response to the display of certain calibrating images, such that the acceptance criteria can be accurately determined for the LCD component 700. In practice, a batch or a lot of LCD components manufactured by a supplier can be subjected to various test images to measure the resulting operating current. Calibration in this manner can provide a realistic range of operating current that can be expected during normal operation of a healthy LCD component. Similarly, LCD components can be damaged, broken, or cracked, and subjected to display instructions that correspond to various test images to measure the resulting operating current. Calibration in this manner can provide a realistic range of operating current that can be expected from a broken or faulty LCD component.

Calibration of healthy and faulty LCD components can be achieved using any number of common display screens (e.g., a home screen, a menu screen, a splash screen, a clock screen, or the like). It might be impractical to calibrate an LCD component based on all possible display screen states. Accordingly, calibration of an LCD component can be based on "outlier" images that are known to result in maximum (or near maximum) and minimum (or near minimum) operating current values. For example, it may be desirable to calibrate LCD components using a black screen, a white screen, a gray screen, or a predetermined test pattern. Calibration in this manner can provide a range of normally expected operating current for a healthy LCD component and/or a range of normally expected operating current for a faulty LCD component. This description assumes that the LCD component 700 can be accurately calibrated such that the acceptance criteria can be programmed into the monitoring controller 706 during fabrication of the host electronic device, and such that the acceptance criteria need not be updated or changed during the life of the host electronic device. If, however, a different LCD component vendor or a different LCD component part number is introduced, then the operating current calibration procedure may need to be repeated to obtain accurate pre-characterized operating current values.

Figure 8:
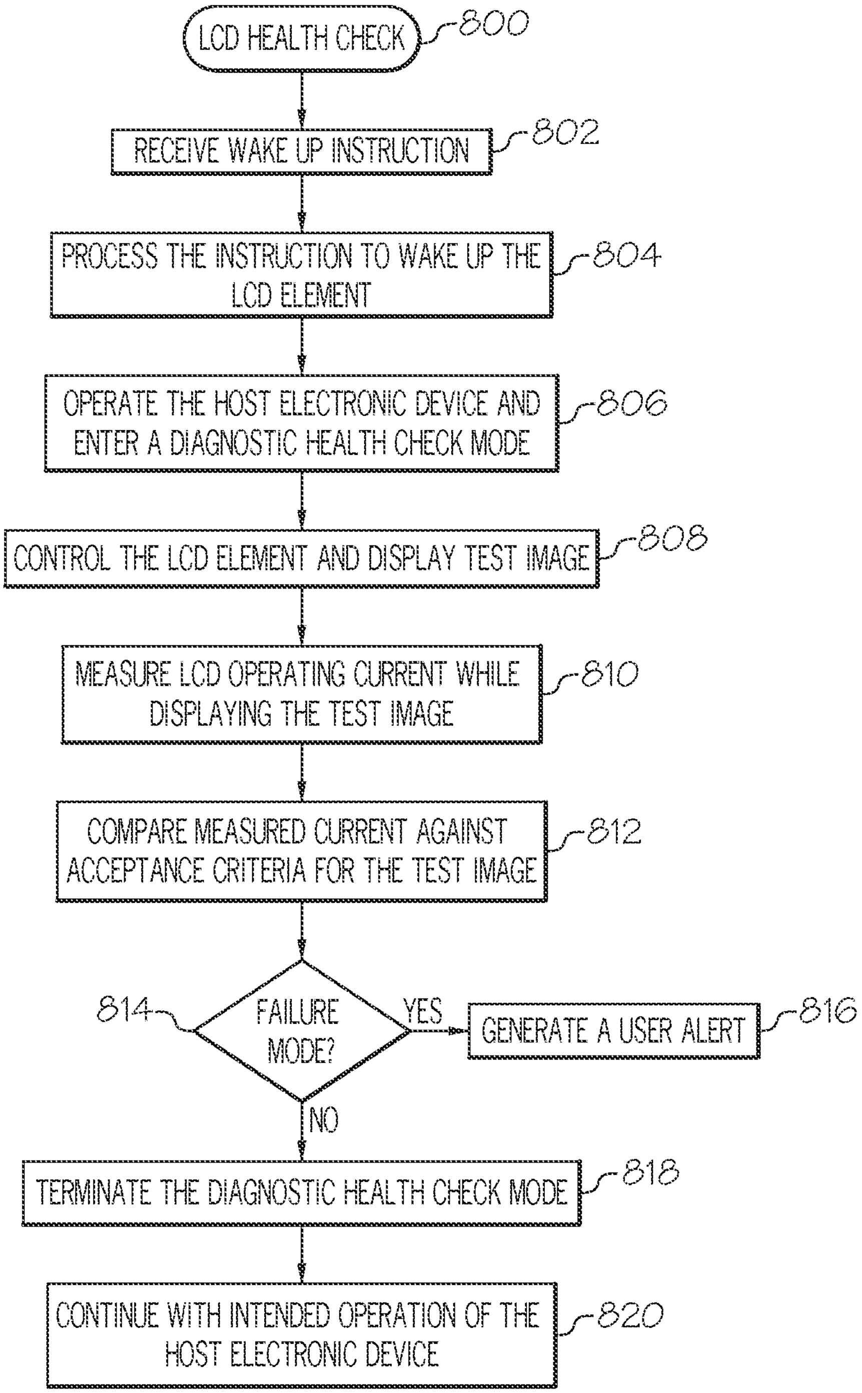
FIG. 8 is a flow chart that illustrates another exemplary embodiment of an LCD health check process.

FIG. 8 is a flow chart that illustrates an exemplary embodiment of another LCD health check process 800. The various tasks performed in connection with the process 800 may be performed by software, hardware, firmware, or any combination thereof. For illustrative purposes, the following description of the process 800 may refer to elements mentioned above in connection with FIGS. 1-4 and 7. It should be appreciated that the process 800 may include any number of additional or alternative tasks, the tasks shown in FIG. 8 need not be performed in the illustrated order, and the process 800 may be incorporated into a more comprehensive procedure or process having additional functionality not described in detail herein. Moreover, one or more of the tasks shown in FIG. 8 could be omitted from an embodiment of the process 800 as long as the intended overall functionality remains intact.

The process 800 assumes that the host electronic device is designed and configured to support the operating current based diagnostic LCD check described above with reference to FIG. 7, and that the monitoring controller 706 has already been programmed with calibrated acceptance criteria that is used to analyze the operating current measurements. Although the diagnostic LCD check can be performed at any time, this example assumes that the LCD check is executed whenever the display becomes active for any reason. Accordingly, the process 800 begins by receiving an instruction to wake up the LCD element from a standby state, a sleep state, or any state having no displayed content associated therewith (task 802). The wake up instruction is processed and handled as needed to wake up the LCD element (task 804). The process 800 continues by operating the host electronic device and entering the diagnostic health check mode (task 806). While in the diagnostic mode, the process 800 controls the LCD element to display an initial image, which can be used to check the health of the LCD element (task 808). As mentioned above, the initial image can be a particular test image or screen, or it can be an image or screen that would otherwise be generated by the host electronic device upon wakeup.

As described above with reference to FIG. 7, displaying an image on the LCD component 700 requires an amount of operating current, which in turn results in the measurable output voltage 718. The output voltage 718 is proportional to the operating current, which allows the process 800 to measure the operating current of the LCD element while displaying the image (task 810). The process 800 continues by comparing the measured operating current against the acceptance criteria for the image (task 812). As explained above, the acceptance criteria can be used to determine whether the measured operating current is indicative of a failure mode of the LCD element (query task 814). In this regard, task 812 can compare the measured operating current against a threshold value, an operating current range, or the like. In certain embodiments, the acceptance criteria defines a threshold value and task 812 checks whether the measured operating current is above/below the threshold value by at least a predefined amount.

If the measured operating current does not satisfy the acceptance criteria (and, therefore, is indicative of the failure mode), then the process 800 generates an alert for a user of the host electronic device, wherein the alert indicates that the LCD apparatus requires service, attention, repair, or the like (task 816). If the measured operating current satisfies the acceptance criteria (and, therefore, is indicative of a healthy LCD element), then the process 800 terminates the diagnostic health check mode (task 818) and continues with the intended operation of the host electronic device (task 820).

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electronic display apparatus for a host electronic device, the electronic display apparatus comprising:

a display element comprising an array of pixel elements formed overlying a substrate and arranged to define a viewable display area;

a display controller coupled to control activation of the array of pixel elements, the display controller formed overlying the substrate; and a conductive trace formed overlying the substrate and arranged to bypass the display controller in a layout that does not interfere with visibility of the array of pixel elements, wherein detection of an electrical discontinuity in the conductive trace is indicative of a failure mode of the display element, and wherein integrity of the conductive trace is monitored by a detection circuit associated with the host electronic device.

2. The electronic display apparatus of claim 1, wherein the conductive trace is located outside the viewable display area.

3. The electronic display apparatus of claim 1, wherein:

the display element further comprises a plurality of electrical address lines to control activation of the pixel elements, the electrical address lines traversing a non-viewable area located between the array of pixel elements and the display controller; and a portion of the conductive trace is arranged overlying the non-viewable area.

4. The electronic display apparatus of claim 1, wherein the detection circuit measures electrical current flowing in the conductive trace during a diagnostic health check operation of the host electronic device.

5. The electronic display apparatus of claim 1, the conductive trace having a first end corresponding to a ground voltage of the host electronic device, and having a second end coupled to a pull-up resistor via a switch.

6. The electronic display apparatus of claim 1, wherein the display element comprises a plurality of transistors formed overlying the substrate.

7. The electronic display apparatus of claim 1, wherein the detection circuit is implemented in a host controller of the host electronic device.

8. The electronic display apparatus of claim 1, wherein at least a portion of the conductive trace is located between columns of the pixel elements.

9. The electronic display apparatus of claim 1, wherein at least a portion of the conductive trace is located between rows of the pixel elements.

10. An electronic display apparatus for a host electronic device, the electronic display apparatus comprising:

a display element comprising an array of pixel elements formed overlying a substrate and arranged to define a viewable display area;

a display controller coupled to control activation of the array of pixel elements, the display controller formed overlying the substrate;

a conductive trace formed overlying the substrate and arranged to bypass the display controller in a layout that does not interfere with visibility of the array of pixel elements; and a detection circuit coupled to the conductive trace, wherein the detection circuit operates to check electrical continuity of the conductive trace to obtain an indication of health of the display element.

11. The electronic display apparatus of claim 10, wherein the electrically conductive trace is located outside the viewable display area.

12. The electronic display apparatus of claim 10, wherein:

the display element further comprises a plurality of electrical address lines to control activation of the pixel elements, the electrical address lines traversing a non-viewable area located between the array of pixel elements and the display controller; and a portion of the conductive trace is arranged overlying the non-viewable area.

13. The electronic display apparatus of claim 10, wherein the detection circuit measures electrical current flowing in the conductive trace during a diagnostic health check operation of the host electronic device.

14. The electronic display apparatus of claim 10, wherein the detection circuit is implemented in a host controller of the host electronic device.

15. The electronic display apparatus of claim 10, wherein at least a portion of the conductive trace is located between columns of the pixel elements.

16. The electronic display apparatus of claim 10, wherein at least a portion of the conductive trace is located between rows of the pixel elements.

* * * * *